United States Patent
Lee et al.

(10) Patent No.: US 10,155,903 B2
(45) Date of Patent: Dec. 18, 2018

(54) METAL ETCHANT COMPOSITIONS AND METHODS OF FABRICATING A SEMICONDUCTOR DEVICE USING THE SAME

(71) Applicants: Hyosan Lee, Hwaseong-si (KR); Yongsun Ko, Suwon-si (KR); Kyoungseob Kim, Suwon-si (KR); Kuntack Lee, Suwon-si (KR); Jihoon Jeong, Suwon-si (KR); Chen Lin, Ithaca, NY (US); Christopher K. Ober, Ithaca, NY (US)

(72) Inventors: Hyosan Lee, Hwaseong-si (KR); Yongsun Ko, Suwon-si (KR); Kyoungseob Kim, Suwon-si (KR); Kuntack Lee, Suwon-si (KR); Jihoon Jeong, Suwon-si (KR); Chen Lin, Ithaca, NY (US); Christopher K. Ober, Ithaca, NY (US)

(73) Assignees: Samsung Electronics Co., Ltd. (KR); Cornell University, Ithaca, NY (US)

(*) Notice: Subject to any disclaimer, the term of this patent is extended or adjusted under 35 U.S.C. 154(b) by 54 days.

(21) Appl. No.: 15/075,709

(22) Filed: Mar. 21, 2016

(65) Prior Publication Data
US 2016/0204001 A1 Jul. 14, 2016

Related U.S. Application Data

(63) Continuation of application No. 14/312,043, filed on Jun. 23, 2014, now abandoned.

(51) Int. Cl.
*B44C 1/22* (2006.01)
*C23F 1/00* (2006.01)
(Continued)

(52) U.S. Cl.
CPC .............. *C09K 13/08* (2013.01); *C23F 1/18* (2013.01); *C23F 1/20* (2013.01); *C23F 1/26* (2013.01);
(Continued)

(58) Field of Classification Search
CPC ......... H01L 21/32134; H01L 21/76802; H01L 21/31111; H01L 2224/03614
See application file for complete search history.

(56) References Cited

U.S. PATENT DOCUMENTS 5,976,769 A * 11/1999 Chapman .............. G02B 1/11
216/72
8,110,508 B2   2/2012 Kang et al.
(Continued)

FOREIGN PATENT DOCUMENTS

JP   2002155382 A   5/2002
JP   2005320608 A   11/2005
(Continued)

OTHER PUBLICATIONS

Bessel et al., Etchant Solutions for the Removal of Cu(O) in a Supercritical CO2-Based 'Dry' Chemical Mechanical Planarization Process for Device Fabrication, *Journal of the American Chemical Society*, 2003, 125: 4980-4981.

*Primary Examiner* — Thomas T Pham
(74) *Attorney, Agent, or Firm* — Myers Bigel, P.A.

(57) ABSTRACT

The present inventive concepts provide metal etchant compositions and methods of fabricating a semiconductor device using the same. The metal etchant composition includes an organic peroxide in a range of about 0.1 wt % to about 20 wt %, an organic acid in a range of about 0.1 wt % to about 70 wt %, and an alcohol-based solvent in a range of about 10 wt % to about 99.8 wt %. The metal etchant composition may be used in an anhydrous system.

17 Claims, 7 Drawing Sheets

(51) Int. Cl.
- *C03C 15/00* (2006.01)
- *C03C 25/68* (2006.01)
- *C25F 3/00* (2006.01)
- *C09K 13/08* (2006.01)
- *H01L 21/027* (2006.01)
- *H01L 21/311* (2006.01)
- *H01L 21/768* (2006.01)
- *H01L 23/00* (2006.01)
- *C23F 1/26* (2006.01)
- *H01L 21/02* (2006.01)
- *H01L 21/3213* (2006.01)
- *H01L 21/67* (2006.01)
- *C23F 1/18* (2006.01)
- *C23F 1/20* (2006.01)

(52) U.S. Cl.
CPC .... *H01L 21/02063* (2013.01); *H01L 21/0273* (2013.01); *H01L 21/31111* (2013.01); *H01L 21/32134* (2013.01); *H01L 21/6708* (2013.01); *H01L 21/67017* (2013.01); *H01L 21/76802* (2013.01); *H01L 24/03* (2013.01); *H01L 24/11* (2013.01); *H01L 2224/03614* (2013.01); *H01L 2224/0401* (2013.01); *H01L 2224/05571* (2013.01); *H01L 2224/05624* (2013.01); *H01L 2224/05647* (2013.01); *H01L 2224/05666* (2013.01); *H01L 2224/05681* (2013.01); *H01L 2224/05684* (2013.01); *H01L 2924/04941* (2013.01); *H01L 2924/04953* (2013.01); *H01L 2924/20102* (2013.01); *H01L 2924/20103* (2013.01); *H01L 2924/20104* (2013.01)

(56) References Cited

U.S. PATENT DOCUMENTS

| | | | |
|---|---|---|---|
| 2004/0003828 A1* | 1/2004 | Jackson | B08B 7/0021 134/1 |
| 2004/0048194 A1* | 3/2004 | Breyta | G03F 7/091 430/271.1 |
| 2006/0278254 A1* | 12/2006 | Jackson | B08B 7/0021 134/21 |
| 2008/0261390 A1* | 10/2008 | Chen | H01L 24/11 438/613 |
| 2009/0192065 A1* | 7/2009 | Korzenski | C11D 7/08 510/176 |
| 2010/0015805 A1 | 1/2010 | Mayer et al. | |
| 2011/0147341 A1 | 6/2011 | Sato et al. | |
| 2013/0048904 A1 | 2/2013 | Adaniya et al. | |
| 2013/0145640 A1 | 6/2013 | Lee et al. | |
| 2013/0296214 A1 | 11/2013 | Barnes et al. | |

FOREIGN PATENT DOCUMENTS

| | | |
|---|---|---|
| JP | 2006057130 A | 3/2006 |
| JP | 2009209430 A | 9/2009 |
| KR | 20110028446 A | 3/2011 |

\* cited by examiner

METAL ETCHANT COMPOSITIONS AND METHODS OF FABRICATING A SEMICONDUCTOR DEVICE USING THE SAME

RELATED APPLICATION INFORMATION

This application is a continuation of U.S. patent application Ser. No. 14/312,043, filed Jun. 23, 2014, the disclosure of which is incorporated by reference herein in its entirety.

BACKGROUND

The present disclosure relates to metal etchant compositions and methods of fabricating a semiconductor device using the same.

As semiconductor devices have become highly integrated, lines and spaces of interconnections in the semiconductor devices have been reduced. Thus, fine-patterning techniques may be desirable in processes for fabricating the interconnections. In addition, low resistances of the interconnections may be beneficial. Interconnection materials may include titanium, tantalum, aluminum, and tungsten.

SUMMARY

Embodiments of the present inventive concepts may provide metal etchant compositions capable of solving, preventing, and/or reducing corrosion and collapse problems of a metal pattern.

Embodiments of the present inventive concepts may also provide methods of fabricating a semiconductor device with improved reliability.

In one aspect, a metal etchant composition may include an organic peroxide in a range of about 0.1 wt % to about 20 wt % based on the total weight of the composition; an organic acid in a range of about 0.1 wt % to about 70 wt % based on the total weight of the composition; and an alcohol-based solvent in a range of about 10 wt % to about 99.8 wt % based on the total weight of the composition.

In some embodiments, at least one of titanium (Ti), titanium nitride (TiN), tantalum (Ta), tantalum nitride (TaN), aluminum (Al), tungsten (W), or copper (Cu) may be etched by a metal etchant composition of the present inventive concepts.

In some embodiments, the organic peroxide may include at least one peroxy ester having a structure of Formula 1, at least one peroxy acid having a structure of Formula 2, at least one diacyl peroxide having a structure of Formula 3, and/or at least one peroxy dicarbonate having a structure of Formula 4.

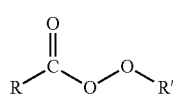

Formula 1

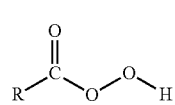

Formula 2

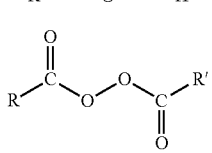

Formula 3

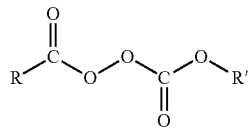

Formula 4

In Formulas 1 to 4, R and R' are each independently a hydrocarbon compound.

In some embodiments, the organic peroxide may include at least one of t-butyl peroxyacetic acid, lauroyl peroxide, or ethyl peroxy dicarbonate.

In some embodiments, the organic acid may have a carbon compound structure in which the number of fluorine atoms is in a range of 3 to 11 or the number of hydrogen atoms is in a range of 3 to 25.

In some embodiments, the organic acid may include at least one of 2,2,2-trifluoroethanoic acid ($CF_3COOH$), 2,2,3,3,4,4,4-heptafluorobutanoic acid ($CF_3CF_2CF_2COOH$), acetic acid ($CH_3COOH$), or butanoic acid ($CH_3CH_2CH_2COOH$).

In some embodiments, the alcohol-based solvent may include a carbon atom of which the number of carbon atoms is in a range of 1 to 15.

In some embodiments, the alcohol-based solvent may include at least one of methanol, ethanol, propanol, isopropanol, heptanol, or octanol.

In some embodiments, the metal etchant composition may further include: a chelating agent in a range of about 0 wt % to about 3 wt % based on the total weight of the composition.

In some embodiments, the chelating agent may include two or more carbonyl groups or two or more amine groups.

In some embodiments, the chelating agent may include at least one of 1,1,1,5,5,5-hexafluoro-2,4-pentanedione [$CF_3C(O)CH_2C(O)CF_3$], 1,1,1-trifluoro-2,4-pentanedione [$CH_3C(O)CH_2C(O)CF_3$], or pentane-2,4-dione [$CH_3C(O)CH_2C(O)CH_3$].

In some embodiments, the metal etchant composition may further include: a surface active agent in a range of about 0 wt % to about 3 wt % based on the total weight of the composition.

In some embodiments, the surface active agent may be a fluorine-based surface active agent.

According to some embodiments, a composition of the present inventive concepts may be anhydrous and may include an organic peroxide, an organic acid, and an alcohol-based solvent.

In some embodiments, the organic peroxide and the organic acid may be present in the composition in a ratio in a range of about 1:1 to about 1:5 (organic peroxide:organic acid).

In some embodiments, the composition may provide an etch rate of a metal layer of about 15 Å/hour to about 40 Å/hour. The metal layer may include at least one of titanium (Ti), titanium nitride (TiN), tantalum (Ta), tantalum nitride (TaN), aluminum (Al), tungsten (W), or copper (Cu).

In some embodiments, the composition may generate oxygen radicals. The composition may etch a metal layer and/or generate oxygen radicals for a period of time of up to about 10 hours after application of the composition to the metal layer. In some embodiments, the composition may substantially continuously etch a metal layer and/or generate oxygen radicals for a period of time, such as, but not limited to, up to about 10 hours or up to about 8 hours after application of the composition to the metal layer.

In some embodiments, a kit may be provided. The kit may include one or more component(s) of a metal etchant composition of the present inventive concepts, such as, but not limited to, an organic peroxide, an organic acid, an alcohol-based solvent, a chelating agent, a surface active agent, and/or a supercritical fluid. The one or more component(s) in the kit may be used to prepare the metal etchant composition. In some embodiments, at least one component in the kit may be separately stored from the other components in the kit. For example, in some embodiments, the organic peroxide may be separately stored from the organic acid and/or the alcohol-based solvent, or the organic acid may be separately stored from the organic peroxide and/or the alcohol-based solvent. In certain embodiments, each component in the kit may be separately stored. The kit may contain one or more component(s) in a particular amount or volume so that when the components are combined to form the metal etchant composition a desired amount of one or more component(s) in the composition and/or a desired ratio is achieved.

In another aspect, a method of fabricating a semiconductor device may include: providing a substrate having a metal-containing layer formed thereon; and removing at least a portion of the metal-containing layer using a metal etchant composition of the present inventive concepts. In some embodiments, the providing step comprises forming a metal-containing layer on the substrate.

In some embodiments, the method including providing a kit of the present inventive concepts and combining and/or mixing the components in the kit to form a metal etchant composition of the present inventive concepts.

In some embodiments, removing the at least a portion of the metal-containing layer may be performed or carried out in a supercritical fluid. In some embodiments, the metal etchant composition further comprises a supercritical fluid and/or the metal etchant composition is used in the presence of a supercritical fluid.

In some embodiments, the supercritical fluid may be a supercritical carbon dioxide fluid. Removing the at least a portion of the metal-containing layer may be performed at a temperature in a range of about 31° C. to about 100° C. and at a pressure in a range of about 73 bar to about 200 bar.

In some embodiments, the metal-containing layer may include at least one of titanium (Ti), titanium nitride (TiN), tantalum (Ta), tantalum nitride (TaN), aluminum (Al), tungsten (W), or copper (Cu).

In some embodiments, removing the at least a portion of the metal-containing layer may be performed at a temperature in a range of about 20° C. to about 80° C.

In some embodiments, the method may further include, before removing the at least a portion of the metal-containing layer, forming an insulating layer covering the metal-containing layer and etching the insulating layer to form an opening exposing the metal-containing layer.

In some embodiments, the method may further include, before removing the at least a portion of the metal-containing layer, forming a photoresist pattern having an opening exposing a portion of the metal-containing layer on the metal-containing layer and removing the photoresist pattern.

In some embodiments, removing the at least a portion of the metal-containing layer may be performed in an anhydrous system.

BRIEF DESCRIPTION OF THE DRAWINGS

The above and other features and advantages of the disclosure will become more apparent in view of the attached drawings and accompanying detailed description.

DETAILED DESCRIPTION OF THE EMBODIMENTS

Figure 1:
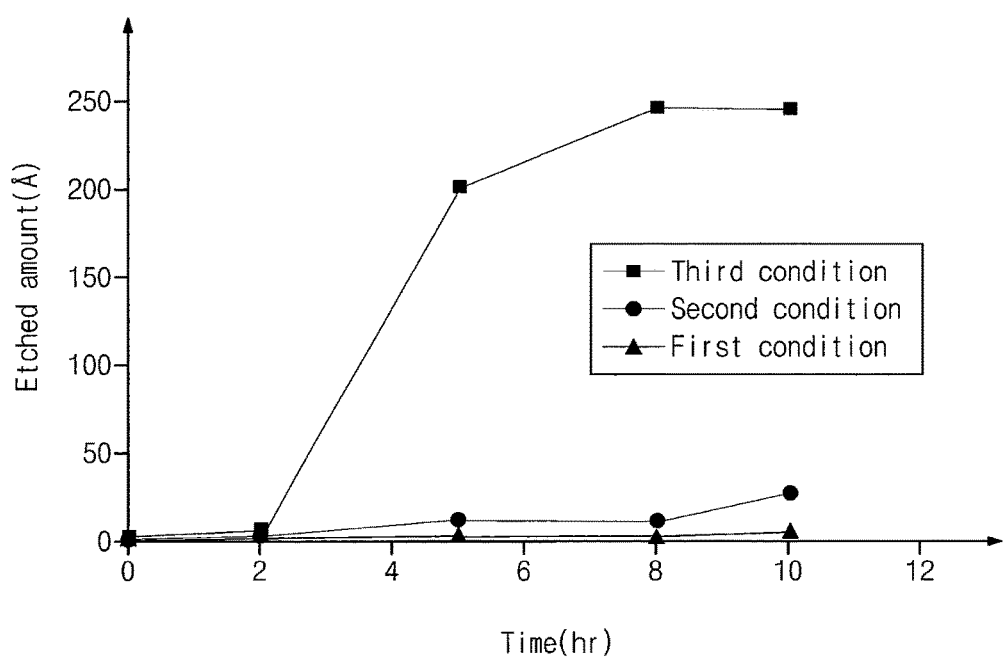
FIG. 1 is a graph of an etched amount of a metal layer over time according to various embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

If an embodiment is differently realizable, a specified operation order may be differently performed from a described order. For example, two consecutive operations may be substantially simultaneously performed, or in an order opposite to the described order.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A metal etchant composition according to the present inventive concepts includes an organic peroxide in a range of about 0.1 wt % to about 20 wt % based on the total weight of the composition, an organic acid in a range of about 0.1 wt % to about 70 wt % based on the total weight of the composition, and an alcohol-based solvent in a range of about 10 wt % to about 99.8 wt % based on the total weight of the composition.

The organic peroxide includes at least one peroxy ester having a structure of Formula 1, at least one peroxy acid having a structure of Formula 2, at least one diacyl peroxide having a structure of Formula 3, and/or at least one peroxy dicarbonate having a structure of Formula 4.

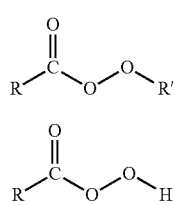

Formula 1

Formula 2

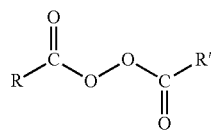

Formula 3

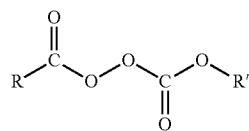

Formula 4

In Formulas 1 to 4, R and R' are each independently a hydrocarbon compound. For example, the organic peroxide may include at least one of t-butyl peroxyacetic acid, lauroyl peroxide, or ethyl peroxy dicarbonate. The organic peroxide may cause an active oxidation reaction in an anhydrous system, and thus it may etch a metal-containing layer. An organic peroxide may be suitable for a cleaning process and/or an etching process. In some embodiments, an organic peroxide may be decomposed relatively slowly. In addition, an organic peroxide may have a higher stability and/or desirable oxidizing power (or reactivity) with respect to a metal-containing layer.

The organic acid may function as an initiator and may activate the oxidation reaction of the organic peroxide and the metal-containing layer. The organic acid may have a carbon compound structure in which the number of fluorine atoms is in a range of 3 to 11 or the number of hydrogen atoms is in a range of 3 to 25. For example, the organic acid may include at least one of 2,2,2-trifluoroethanoic acid ($CF_3COOH$), 2,2,3,3,4,4,4-heptafluorobutanoic acid ($CF_3CF_2CF_2COOH$), acetic acid ($CH_3COOH$), or butanoic acid ($CH_3CH_2CH_2COOH$).

The alcohol-based solvent may remove an etch by-product or a by-product of a cleaning process. The alcohol-based solvent may include a carbon atom of which the number of carbon atoms is in a range of 1 to 15. For example, the alcohol-based solvent may include at least one of methanol, ethanol, propanol, isopropanol, heptanol, or octanol.

The metal etchant composition may further include a chelating agent in a range of about 0 wt % to about 3 wt % based on the total weight of the composition. The chelating agent may include two or more carbonyl groups or two or more amine groups. For example, the chelating agent may include at least one of 1,1,1,5,5,5-hexafluoro-2,4-pentanedione [$CF_3C(O)CH_2C(O)CF_3$], 1,1,1-trifluoro-2,4-pentanedione [$CH_3C(O)CH_2C(O)CF_3$], or pentane-2,4-dione [$CH_3C(O)CH_2C(O)CH_3$]. The chelating agent may protect a surface of the metal-containing layer or may change a property of the surface of the metal-containing layer.

The metal etchant composition may further include a surface active agent in a range of about 0 wt % to about 3 wt % based on the total weight of the composition. The surface active agent may be a fluorine-based surface active agent. For example, the surface active agent may include at least one of $R_fCH_2CH_2SCH_2CH_2CO_2Li$, $(R_fCH_2CH_2O)P(O)(ONH_4)_2$($R_fCH_2CH_2O)_2P(O)(ONH_4)$, $(R_fCH_2CH_2O)P(O)(OH)_2$($R_fCH_2CH_2O)2P(O)(OH)$, $R_fCH_2CH_2O(CH_2CH_2O)_xH$, $R_fCH_2CH_2SO_3X$ wherein $R_f$=$CF_3$($CF_2CF_2)_2$, $x$=1~10, and X is hydrogen (H) or an ammonium ($NH_4$) ion, sodium bis(2,2,3,3,4,4,5,5-octafluoro-1-pentyl)-2-sulfosuccinate, polyethyleneoxide-block-polyfluorooctyl methacrylate, or N-ethyl-4,4,5,5,6,6,7,7,8,8,9,9,9-tridecafluoro-N-methyl-N-(4,4,5,5,6,6,7,7,8,8,9,9,9- tridecafluorononyl)nonan-1-ammonium acetate. The metal etchant composition may be well mixed with a supercritical fluid. In some embodiments, the surface active agent may reduce and/or minimize the occurrence of particles.

A metal-containing layer etchable by a metal etchant composition of the present inventive concepts may include at least one of titanium (Ti), titanium nitride (TiN), tantalum (Ta), tantalum nitride (TaN), aluminum (Al), tungsten (W), or copper (Cu).

The metal etchant composition may be applied in an anhydrous system in which water does not exist. In some embodiments, water is not directly added to the metal etchant composition as a distinct, separate component of the composition. In some embodiments, the metal etchant composition may be used by itself or the metal etchant composition may be used in and/or with a supercritical fluid.

In the metal etchant composition according to the present inventive concepts, oxygen radicals may be activated from the organic peroxide by the organic acid, and the alcohol-based solvent may stabilize the activated oxygen radicals. As a result, an effective metal etching reaction may be continuously caused by the metal etchant composition according to the present inventive concepts.

The metal etchant composition according to some embodiments may be used in an anhydrous system and may be cleanly removed without scum, such as, but not limited to, an etch by-product and/or an etch residue. Thus, a process of using the metal etchant composition may not need or require an additional cleaning process using water, so the corrosion and collapse problems associated with a metal pattern when water is utilized may not occur. In addition, the metal etchant composition may not corrode the metal pattern. Moreover, the metal etchant composition may have a low surface tension and this may prevent the collapse of the metal pattern. Furthermore, the metal etchant composition of the present inventive concepts may be applied in a supercritical fluid. This feature may be applied to a method of fabricating a semiconductor device, so reliability of the semiconductor device may be improved.

According to some embodiments of the present inventive concepts, a kit may be provided. The kit may include one or more component(s) of a metal etchant composition of the present inventive concepts, such as, but not limited to, an organic peroxide, an organic acid, an alcohol-based solvent, a chelating agent, a surface active agent, and/or a supercritical fluid. The one or more component(s) in the kit may be used to prepare the metal etchant composition. In some embodiments, the kit may include an organic peroxide, an organic acid, and an alcohol-based solvent.

In some embodiments, at least one component in the kit may be separately stored from the other components in the kit. For example, in some embodiments, the organic peroxide may be separately stored from the organic acid and/or the alcohol-based solvent, or the organic acid may be separately stored from the organic peroxide and/or the alcohol-based solvent. In certain embodiments, each component in the kit may be separately stored.

The kit may contain one or more component(s) in a particular amount or volume so that when the components are combined to form the metal etchant composition a desired amount of one or more component(s) in the composition and/or desired ratio is achieved. For example, the kit may provide an organic peroxide and an organic acid in a particular amount or volume so that the ratio of the organic peroxide to the organic acid in the composition is in a range of about 1:1 to about 1:5. In some embodiments, the organic peroxide and organic acid are separately stored in the kit and when they are combined with an alcohol-based solvent, which may be separately stored or stored with one or more component(s) in the kit, to form a metal etchant composition of the present inventive concepts a desired ratio of the organic peroxide to the organic acid in the composition is achieved.

A method of fabricating a semiconductor device using a metal etchant composition according to the present inventive concepts will be described in detail hereinafter.

Figure 2:
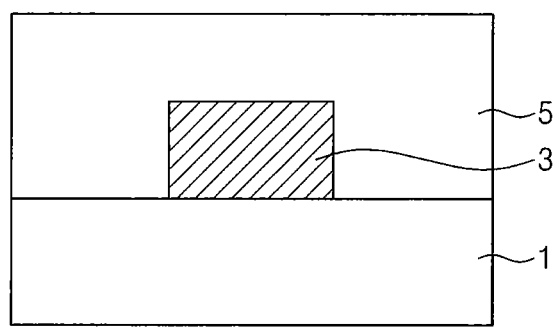
FIGS. 2 to 4 are cross-sectional views illustrating a method of fabricating a semiconductor device according to various embodiments of the present inventive concepts.
Figure 3:
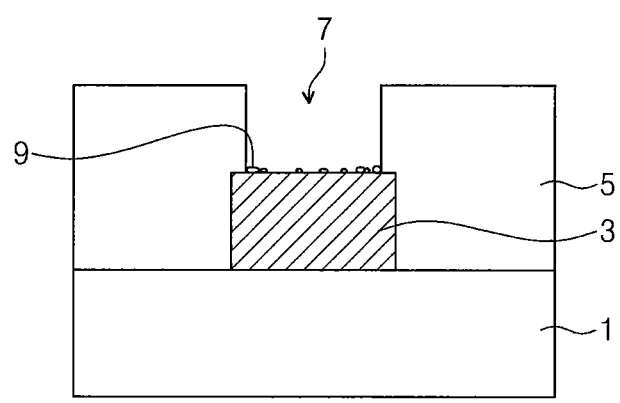
Figure 4:
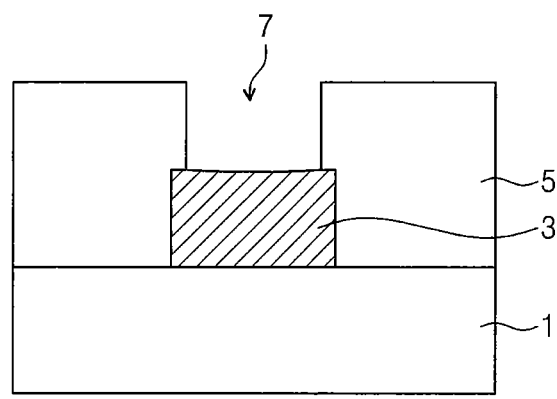

FIGS. 2 to 4 are cross-sectional views illustrating a method of fabricating a semiconductor device according to various embodiments of the present inventive concepts.

Referring to FIG. 2, a metal-containing pattern 3 is formed on a lower structure 1. The lower structure 1 may be a semiconductor substrate. Alternatively, the lower structure 1 may be a conductive pattern or an insulating layer formed on a semiconductor substrate. The metal-containing pattern 3 may include at least one of titanium (Ti), titanium nitride (TiN), tantalum (Ta), tantalum nitride (TaN), aluminum (Al), tungsten (W), or copper (Cu). An interlayer insulating layer 5 is formed on the lower structure 1 having the metal-containing pattern 3. The interlayer insulating layer 5 may be formed of a silicon oxide-based material.

Referring to FIG. 3, the interlayer insulating layer 5 is etched to form a via-hole 7 exposing the metal-containing pattern 3. Etch residues 9 may be formed on a top surface of the metal-containing pattern 3 exposed by the via-hole 7. The etch residues 9 may be etch by-products.

Referring to FIG. 4, a cleaning process is performed to remove the etch residues 9. The cleaning process may be performed using a metal etchant composition of the present inventive concepts which etches the metal-containing pattern 3. The metal etchant composition may be the same as a composition described herein.

Figure 5:
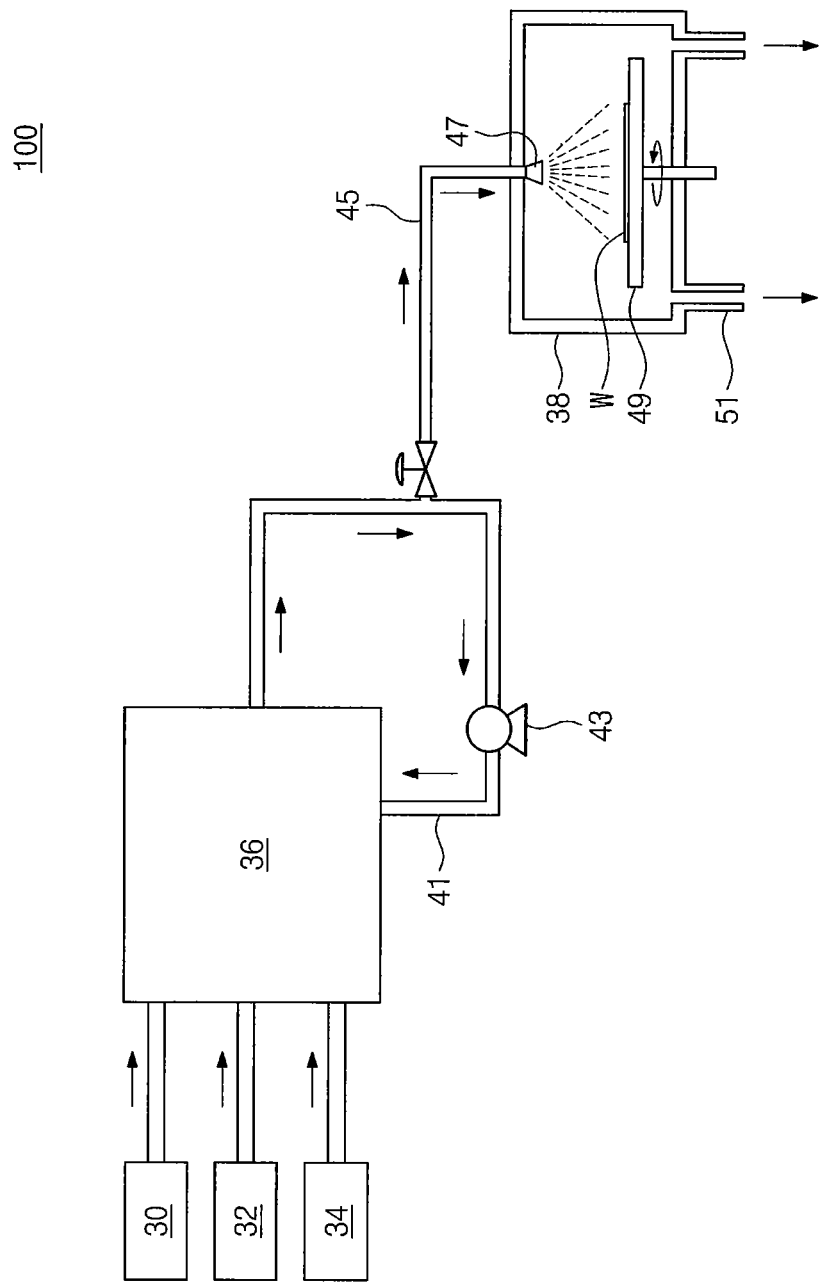
FIGS. 5 and 6 are schematic illustrations of cleaning apparatuses according to various embodiments of the present inventive concepts.
Figure 6:
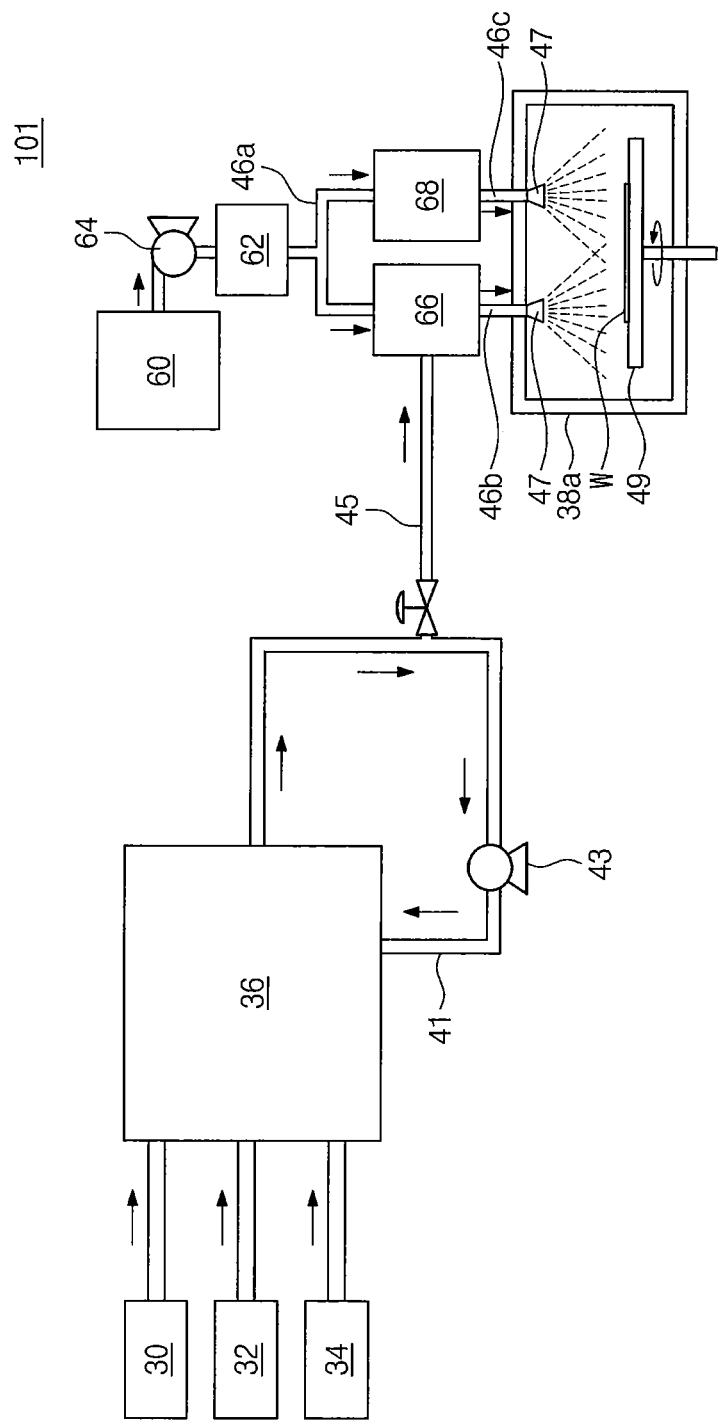

The cleaning process may be performed using cleaning apparatus 100 or 101 of FIG. 5 or 6.

Referring to FIG. 5, the cleaning apparatus 100 according to an embodiment of the present inventive concepts includes first to third raw-material tanks 30, 32, and 34, a mixing tank 36, a cleaning chamber 38, a pump 43, and pipes 41 and 45. An organic peroxide may be stored in the first raw-material tank 30. An organic acid may be stored in the second raw-material tank 32. An alcohol-based solvent may be stored in the third raw-material tank 34. These raw materials may be mixed with each other in composition ratios, such as, but not limited to those described herein, within mixing tank 36 to form a metal etchant composition. The metal etchant composition in mixing tank 36 may be forcibly mixed by pump 43 and a first pipe 41. The mixed metal etchant composition may be transferred to the cleaning chamber 38 through a second pipe 45. An injection nozzle 47 is installed at one end of the second pipe 45. A chuck 49 on which a wafer W is loaded may be disposed in the cleaning chamber 38. The chuck 49 may be an electrostatic chuck or a vacuum chuck. The chuck 49 may be rotatable. An exhaust pipe 51 may be connected to a lower portion of the cleaning chamber 38. The patterns illustrated in FIG. 3 may be formed on the wafer W. The wafer W may be rotated, and the metal etchant composition may jetted, dripped, sprayed, and/or the like onto a top surface of the wafer W. An inner space of the cleaning chamber may be maintained at a temperature in a range of 20° C. to 80° C. The pressure in the inner space of the cleaning chamber may be atmospheric pressure. The metal etchant composition may be exhausted and/or removed through exhaust pipe 51.

The cleaning process using the cleaning apparatus 100 of FIG. 5 may be performed with an organic material in an anhydrous system in which water is not present. Since the cleaning process is performed with a metal etchant composition of the present inventive concepts containing an alcohol-based solvent having a surface tension lower than that of water, it may be possible to prevent patterns from collapsing. In addition, corrosion of the metal-containing pattern 3 may not occur by using a composition and/or process according to the present inventive concepts.

Referring to FIG. 6, a cleaning apparatus 101 according to another embodiment of the present inventive concepts includes first to third raw-material tanks 30, 32, and 34, a mixing tank 36, a cleaning chamber 38a, pumps 43 and 64, pipes 41, 45, 46a, 46b, and 46c, storage units 66 and 68, a temperature controller 62, and a carbon dioxide ($CO_2$)-storing tank 60. Like FIG. 5, an organic peroxide, an organic acid, and an alcohol-based solvent may be stored in the first raw-material tank 30, the second raw-material tank 32, and the third raw-material tank 34, respectively. These raw materials may be mixed with each other in defined composition ratios within mixing tank 36 to form a metal etchant composition. The metal etchant composition in mixing tank 36 may be forcibly mixed by pump 43 and a first pipe 41. The mixed metal etchant composition may then be transferred to a first storage unit 66 through a second pipe 45. Carbon dioxide may be outputted from the carbon dioxide-storing tank 60 and then converted into a supercritical fluid using a high-pressure pump 64 and a temperature controller 62. Here, the temperature of the supercritical carbon dioxide fluid may be in a range of about 31° C. to about 100° C., and the pressure of the supercritical carbon dioxide fluid may be in a range of about 73 bar to about 200 bar. The supercritical carbon dioxide fluid may be divided and stored in the first storage unit 66 and a second storage unit 68 through a third pipe 46a. The supercritical carbon dioxide fluid may be mixed with the metal etchant composition in the first storage unit 66. An injection nozzle 47 may be installed at one end of each of the fourth and fifth pipes 46b and 46c respectively connected to the first and second storage units 66 and 68. A chuck 49 on which a wafer W is loaded may be disposed in the cleaning chamber 38a. The chuck 49 may be an electrostatic chuck or a vacuum chuck. The chuck 49 may be rotatable. Inner spaces of the third to fifth pipes 46a, 46b, and 46c, inner spaces of the storage units 66 and 68, and an inner space of the cleaning camber 38a may be maintained at a temperature in the range of about 31° C. to about 100° C. and at a pressure in the range of about 73 bar to about 200 bar.

A cleaning process using the cleaning apparatus 101 of FIG. 6 may be performed in a supercritical fluid in an anhydrous system in which water is not present. Since the supercritical carbon dioxide fluid has a surface tension lower than that of water, it may be possible to prevent patterns from collapsing. In addition, the supercritical carbon dioxide fluid does not remain as a residue and/or by-product on the wafer W after the cleaning process and thus using a composition and/or process according to the present inventive concepts may solve problems associated with a remaining solvent. Further, corrosion of the metal-containing pattern 3 may not occur by using a composition and/or process according to the present inventive concepts.

FIGS. 7 to 10 are cross-sectional views illustrating a method of fabricating a semiconductor device according to various embodiments of the present inventive concepts.

Figure 7:
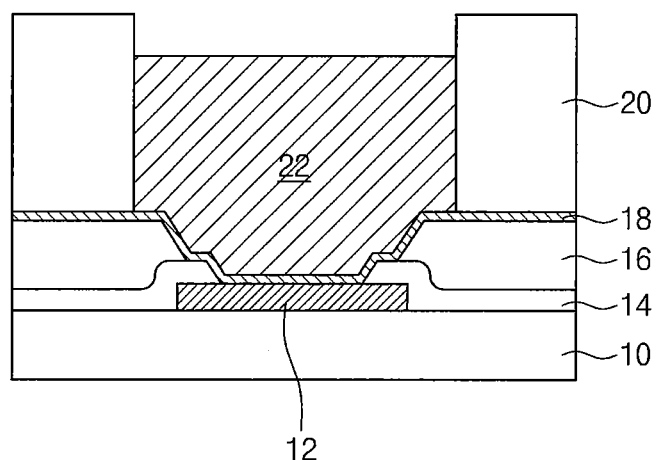
FIGS. 7 to 10 are cross-sectional views illustrating a method of fabricating a semiconductor device according to various embodiments of the present inventive concepts.

Referring to FIG. 7, a conductive pad 12 is formed on a lower structure 10. The lower structure 10 may include a semiconductor substrate with circuit patterns and an interlayer insulating layer formed on the semiconductor substrate. A first passivation layer 14 and a second passivation layer 16 are formed on the conductive pad 12 and the lower structure 10. The first and second passivation layers 14 and 16 expose a portion of the conductive pad 12 and cover the lower structure 10. The first passivation layer 14 may include, for example, a silicon nitride layer, and the second passivation layer 16 may include, for example, a polyimide layer. A metal-containing layer 18 is conformally formed on an entire top surface of the lower structure 10 having the first and second passivation layers 14 and 16. The metal-containing layer 18 may be formed of, for example, a titanium layer and a copper-containing layer. The titanium layer may act as an adhesion layer and/or a diffusion-preventing layer, and the copper-containing layer may act as a seed layer. A photoresist pattern 20 is formed on the metal-containing layer 18. The photoresist pattern 20 is formed to have an opening that exposes the metal-containing layer 18 overlapping with the conductive pad 12. A planting process is performed to form a bump 22 filling the opening on the metal-containing layer 18 not covered by the photoresist pattern 20. The bump 22 may include at least one of lead (Pb), nickel (Ni), or tin (Sn).

Figure 8:
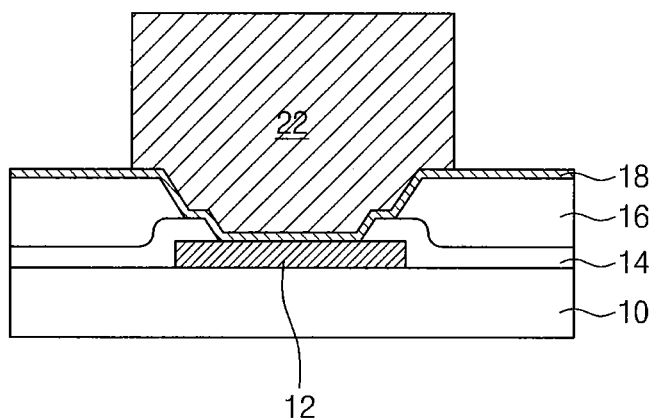

Referring to FIG. 8, the photoresist pattern 20 is removed to expose the metal-containing layer 18. The photoresist pattern 20 may be removed by an ashing process.

Figure 9:
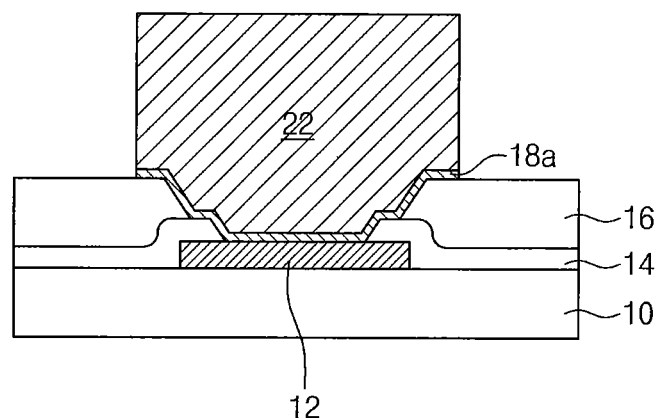

Referring to FIG. 9, the exposed metal-containing layer 18 is removed using a metal etchant composition of the present inventive concepts. The metal etchant composition may be the same as or similar to a metal etchant composition described herein. The etching process of the metal-containing layer 18 using the metal etchant composition may be the same as or similar to a cleaning process using a cleaning apparatus 100 and/or 101 as described herein. As a result, a metal-containing pattern 18a remains under bump 22, and a top surface of the second passivation layer 16 is exposed.

Figure 10:
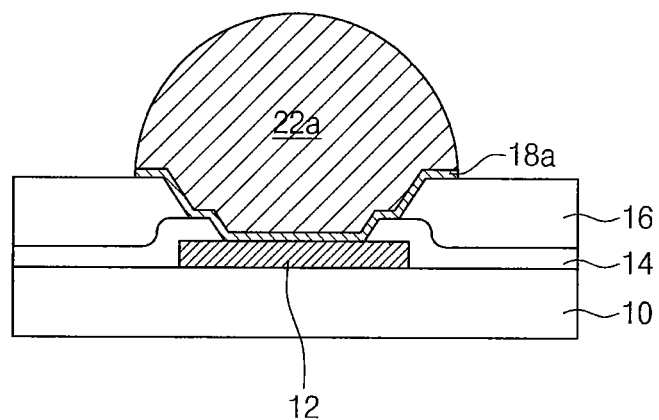

Referring to FIG. 10, the bump 22 may be reflowed by heat to form a globular bump 22a.

As described above, a method of fabricating a semiconductor device can be performed using a metal etchant composition of the present inventive concepts. However, the applications of a metal etchant composition according to the present inventive concepts are not limited to the embodiments described herein.

In a metal etchant composition according to embodiments of the present inventive concepts, oxygen radicals may be activated from the organic peroxide by the organic acid and the alcohol-based solvent may stabilize the activated oxygen radicals. As a result, an effective metal etching reaction may be continuously caused to effectively and stably etch a metal. In addition, the metal etchant composition may be used in an anhydrous system to cleanly remove scum such as, but not limited to, etch by-products and etch residues. Thus, a process using a metal etchant composition according to the present inventive concepts does not need an additional cleaning process using water. This may prevent the corrosion and/or collapse problems caused by water when used with a metal pattern.

A metal etchant composition of the present inventive concepts may not corrode the metal pattern. Additionally, the metal etchant composition may have a low surface tension, so collapse of the metal pattern may be prevented. Furthermore, the metal etchant composition can be used in a supercritical fluid. As a result, the metal etch composition may be applied to a method of fabricating a semiconductor device to improve the reliability of the semiconductor device.

Experimental examples using a metal etchant composition according to the present inventive concepts will be described hereinafter.

EXAMPLES

Example 1

This first experimental example was performed to determine an etched amount of a titanium nitride (TiN) layer using a metal etchant composition according to the present inventive concepts.

Three metal etchant compositions were prepared with each optionally including t-butyl peroxyacetic acid as the organic peroxide, 2,2,3,3,4,4,4-heptafluorobutanoic acid ($CF_3CF_2CF_2COOH$) as the organic acid, and isopropyl alcohol as the alcohol-based solvent.

The first metal etchant composition (i.e., the first condition) was a solution including the organic peroxide in an amount of 5.5 wt % and the organic acid in an amount of 94.5 wt %.

The second metal etchant composition (i.e., the second condition) was a solution including the organic acid in an amount of 63.5 wt % and the alcohol-based solvent in an amount of 36.5 wt %.

The third metal etchant composition (i.e., the third condition) was a solution including the organic peroxide in an amount of 3.5 wt %, the organic acid in an amount of 61.3 wt %, and the alcohol-based solvent in an amount of 35.2 wt %.

Wafers having a titanium nitride layer were obtained. A wafer was dipped in one of the three compositions at a temperature of 60° C. for a predetermined process time. The wafers were unloaded from the compositions after the predetermined process time and were then rinsed with isopropyl alcohol. Thereafter, the wafers were dried using nitrogen. Next, the thickness of the remaining titanium nitride layer was measured to determine the etched amount of the titanium nitride layer on each of the wafers. FIG. 1 is a graph of the etched amount of the titanium nitride layer according to the process time.

Referring to FIG. 1, it was determined that the third composition including all three components (i.e., the organic peroxide, the organic acid, and the alcohol-based solvent) has excellent etch-ability. If either the organic peroxide or the alcohol-based solvent is omitted, the titanium nitride layer is hardly etched. As a result, it is confirmed that the metal-containing layer can be effectively etched by a metal etchant composition including an organic peroxide, an organic acid, and an alcohol-based solvent according to the present inventive concepts.

Example 2

This second experimental example was performed to determine an etched amount of a titanium nitride (TiN) layer using metal etchant compositions containing various solvents.

Each of the metal etchant compositions in this second experimental example included t-butyl peroxyacetic acid as the organic peroxide and 2,2,3,3,4,4,4-heptafluorobutanoic acid ($CF_3CF_2CF_2COOH$) as the organic acid. Each of the compositions included one of the following solvents: isopropyl alcohol, ethanol, N,N-dimethyl formaldehyde (DMF), acetone, toluene, or 1,1,1,3,3,3-hexafluoro-2-propanol (F-IPA). Each of the compositions in this example included the organic peroxide in an amount of 11.1 wt %, the organic acid in an amount of 36.5 wt %, and the solvent in an amount of 52.4 wt %.

Wafers having the titanium nitride layer were obtained. A wafer was dipped in one of the respective compositions at a temperature of 60° C. for 8 hours. The wafers were unloaded from each of the compositions after 8 hours and were then rinsed with isopropyl alcohol. Thereafter, the wafers were dried using nitrogen. Next, the thickness of the remaining titanium nitride layer on each wafer was measured to confirm the etched amount of the titanium nitride layer. Table 1 shows the etched amount of the titanium nitride layer according to the solvent present in the composition.

TABLE 1

| Solvent | Isopropyl alcohol | Ethanol | DMF | Acetone | Toluene | F-IPA |
|---|---|---|---|---|---|---|
| Etched amount of TiN (Å) | 244 | 244 | 14 | 15 | 2 | 1 |

Referring to Table 1, the etched amount of the titanium nitride layer is high when the solvent is an alcohol-based solvent such as isopropyl alcohol or ethanol. On the other hand, the etched amount of the titanium nitride layer is low when the solvent is a non-alcohol-based solvent such as DMF, acetone, toluene, or F-IPA. As a result, an alcohol-based solvent is suitable for the metal etchant compositions according to the present inventive concepts.

Example 3

This third experimental example was performed to determine the etched amounts of various layers when etched by a metal etchant composition of the present inventive concepts.

Each of the metal etchant compositions in this second experimental example included t-butyl peroxyacetic acid as the organic peroxide and 2,2,3,3,4,4,4-heptafluorobutanoic acid ($CF_3CF_2CF_2COOH$) as the organic acid. Each of the compositions included isopropyl alcohol as the alcohol-based solvent. Each of the compositions in this example included the organic peroxide in an amount of 11.1 wt %, the organic acid in an amount of 36.5 wt %, and the solvent in an amount of 52.4 wt %. Wafers having one of the following layers were prepared: a titanium nitride layer, a silicon oxide layer, a silicon nitride layer, or a poly-silicon layer. Each of the wafers was dipped in the composition at a temperature of 60° C. for 10 hours. Each of the wafers was unloaded from the composition after the 10 hours and was then rinsed with isopropyl alcohol. Subsequently, each of the wafers was dried using nitrogen. Thereafter, the thickness of the remaining portion of each layer was measured to determine an etched amount of each layer. Table 2 shows the etched amount of the various layers etched by a composition of the present inventive concepts.

TABLE 2

| Layer | Titanium nitride layer | Silicon oxide layer | Silicon nitride layer | Poly-silicon layer |
|---|---|---|---|---|
| Etched amount (Å) | 249 | 0.3 | 0.1 | 0.7 |

Referring to Table 2, the titanium nitride layer was sufficiently etched by the composition of the present inventive concepts. On the other hand, the other layers tested (i.e., the silicon oxide layer, the silicon nitride layer, and the poly-silicon layer) were hardly etched by the composition of the present inventive concepts. As shown in Table 2, an etch ratio of the titanium nitride layer to another layer using the composition of the present inventive concepts is about 250:1 or more.

Example 4

In this fourth experimental example, a metal etchant composition of the present inventive concepts was applied in a supercritical carbon dioxide ($CO_2$) fluid.

Compositions were prepared as set forth in Table 3. The first composition (Composition #1) included t-butyl peroxyacetic acid (t-BPA) as the organic peroxide. Compositions #2-4 each included t-butyl peroxy benzoic acid (t-BPBA) as the organic peroxide. Compositions #1-4 each included 2,2,3,3,4,4,4-heptafluorobutanoic acid ($CF_3CF_2CF_2COOH$; F3) as the organic acid. Compositions #1-3 each included isopropyl alcohol (IPA) as the alcohol-based solvent. Composition #4 included a mixed solution of ethanol, butanol, heptanol, and decanol as the alcohol-based solvent. Each of Compositions #1-4 included the organic peroxide in an amount of 11.1 wt %, the organic acid in an amount of 36.5 wt %, and the alcohol-based solvent in an amount of 52.4 wt %.

N-ethyl-4,4,5,5,6,6,7,7,8,8,9,9,9-tridecafluoro-N-methyl-N-(4,4,5,5,6,6,7,7,8,8,9,9,9-tridecafluorononyenonan-1-aminium acetate (QAS-4) was added as a surface active agent in Composition #2. The amount of the surface active agent was 0.05 wt % with respect to the total weight of Composition #2. Therefore, Composition #2 includes the organic peroxide in an amount of 11.09445 wt %, the organic acid in an amount of 36.48175 wt %, the alcohol-based solvent in an amount of 52.3738 wt % and the surface active agent in an amount of 0.05 wt %.

Wafers having titanium nitride layers were obtained. The cleaning processes were performed in a cleaning apparatus 100 of FIG. 5 or a cleaning apparatus 101 of FIG. 6. Etch rates of the titanium nitride layers during the cleaning processes are shown in Table 3.

TABLE 3

| Com-position # | Composition | | | | Result of experiment | |
|---|---|---|---|---|---|---|
| | Organic acid | Organic peroxide | Alcohol-based solvent | Additive | Etch rate of TiN in a liquid state (Å/minute) | Etch rate of TiN in supercritical $CO_2$ fluid (Å/hour) |
| 1 | F3 | t-BPA | IPA | — | 25 | 17 or more |
| 2 | F3 | t-BPBA | IPA | QAS-4 | 23 | 20 or more |
| 3 | F3 | t-BPBA | IPA | — | 25 | 15 or more |
| 4 | F3 | t-BPBA | ethanol, butanol, heptanol, decanol | — | 20 or more | 15 or more |

Referring to Table 3, the etch rates of TiN using one of Compositions #1-4 in a liquid state were obtained from titanium nitride (TiN) layers etched using the cleaning apparatus 100 of FIG. 5. The etch rates of TiN using one of Compositions #1-4 in supercritical $CO_2$ fluid were obtained from titanium nitride (TiN) layers etched using the cleaning apparatus 101 of FIG. 6. Here, a supplied amount of the supercritical $CO_2$ fluid was 20 cc. As shown in Table 3, the metal etchant compositions of the present inventive concepts can etch the titanium nitride layer in the supercritical $CO_2$ fluid as well as the liquid state. As a result, the metal etchant composition of the present inventive concepts can be used in supercritical $CO_2$ fluid.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of fabricating a semiconductor device, the method comprising:
providing a substrate having a metal-containing layer formed thereon; and
etching the metal-containing layer using a metal etchant composition,
wherein etching the metal-containing layer is carried out in a process chamber comprising two separate inlets,
wherein etching the metal-containing layer comprises:
providing a composition consisting of a supercritical fluid;
mixing the metal etchant composition and a first portion of the composition consisting of the supercritical fluid in a storage unit to prepare a mixture; and
providing the mixture of the metal etchant composition and the first portion of the composition consisting of the supercritical fluid stored in the storage unit through a first inlet of the two separate inlets and providing a second portion of the composition consisting of the supercritical fluid through a second inlet of the two separate inlets onto the metal-containing layer at the same time, and
wherein the metal etchant composition comprises:
an organic peroxide in a concentration in a range of about 0.1 to about 20 wt. % based on a total weight of the metal etchant composition;
an organic acid in a concentration in a range of about 0.1 to about 70 wt. % based on the total weight of the metal etchant composition; and
an alcohol-based solvent in a concentration in a range of about 10 to about 99.8 wt. % based on the total weight of the metal etchant composition.

2. The method of claim 1, wherein the organic peroxide includes at least one peroxy ester having a structure of Formula 1, at least one peroxy acid having a structure of Formula 2, at least one diacyl peroxide having a structure of Formula 3, and/or at least one peroxy dicarbonate having a structure of Formula 4,

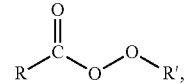

Formula 1

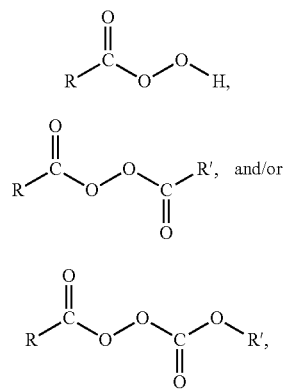

Formula 2

Formula 3

Formula 4 wherein R and R' are each independently a hydrocarbon compound.

3. The method of claim 2, wherein the organic peroxide includes at least one of t-butyl peroxyacetic acid, lauroyl peroxide, or ethyl peroxy dicarbonate.

4. The method of claim 1, wherein the organic acid comprises carbon and 3 to 11 fluorine atoms or 3 to 35 hydrogen atoms.

5. The method of claim 4, wherein the organic acid includes at least one of 2,2,2-trifluoroethanoic acid ($CF_3COOH$), 2,2,3,3,4,4,4-heptafluorobutanoic acid ($CF_3CF_2CF_2COOH$), acetic acid ($CH_3COOH$), or butanoic acid ($CH_3CH_2CH_2COOH$).

6. The method of claim 1, wherein the alcohol-based solvent includes 1 to 15 carbon atom(s).

7. The method of claim 1, wherein the supercritical fluid is a supercritical carbon dioxide fluid.

8. The method of claim 1, wherein etching the metal-containing layer is performed at a temperature in a range of about 31° C. to about 100° C. and at a pressure in a range of about 73 bar to about 200 bar.

9. The method of claim 1, wherein etching the metal-containing layer is performed in an anhydrous system.

10. A method of fabricating a semiconductor device, the method comprising:
providing a substrate having a metal-containing layer formed thereon; and
removing the metal-containing layer using a metal etchant composition,
wherein removing the metal-containing layer is carried out in a process chamber comprising two separate inlets,
wherein removing the metal-containing layer comprises:
providing a composition consisting of a supercritical fluid;
mixing the metal etchant composition and a first portion of the composition consisting of the supercritical fluid in a storage unit to prepare a mixture; and
providing the mixture of the metal etchant composition and the first portion of the composition consisting of the supercritical fluid stored in the storage unit through a first inlet of the two separate inlets and providing a second portion of the composition consisting of the supercritical fluid through a second inlet of the two separate inlets onto the metal containing layer at the same time, and
wherein the metal etchant composition comprises:
an organic peroxide;
an organic acid; and
an alcohol-based solvent,
wherein the metal etchant composition is anhydrous.

11. The method of claim 10, wherein the organic peroxide and the organic acid are present in the metal etchant composition in a ratio in a range of about 1:1 to about 1:5 (organic peroxide:organic acid).

12. The method of claim 10, wherein the metal etchant composition provides an etch rate of the metal-containing layer of about 15 Å/hour to about 40Å/hour.

13. The method of claim 10, wherein the organic peroxide is present in a concentration in a range of about 0.1 to about 20 wt. % based on a total weight of the metal etchant composition,
wherein the organic acid is present in a concentration in a range of about 0.1 to about 70wt. % based on the total weight of the metal etchant composition, and
wherein the alcohol-based solvent is present in a concentration in a range of about 10 to about 99.8 wt. % based on the total weight of the metal etchant composition.

14. The method of claim 10, wherein the metal-containing layer is a titanium (Ti) layer, a tantalum (Ta) layer, an aluminum (Al) layer, a tungsten (W) layer, or a copper (Cu) layer.

15. A method of fabricating a semiconductor device, the method comprising:
providing a substrate having a metal-containing layer formed thereon; and
removing the metal-containing layer using a metal etchant composition,
wherein removing the metal-containing layer comprises:
providing a composition consisting of a supercritical fluid;
mixing the metal etchant composition and a first portion of the composition consisting of the supercritical fluid in a storage unit to prepare a mixture; and
providing the mixture of the metal etchant composition and the first portion of the composition consisting of the supercritical fluid stored in the storage unit, through a first inlet of two separate inlets of a process chamber, on the metal-containing layer, and providing a second portion of the composition consisting of the supercritical fluid, through a second inlet of the two separate inlets of the process chamber, on the metal-containing layer,
wherein providing the mixture and providing the second portion of the composition consisting of the supercritical fluid are performed at the same time,
wherein the metal etchant composition comprises:
an organic peroxide in a concentration in a range of about 0.1 to about 20 wt. % based on a total weight of the metal etchant composition;
an organic acid in a concentration in a range of about 0.1 to about 70 wt. % based on the total weight of the metal etchant composition; and
an alcohol-based solvent selected from the group consisting of methanol, ethanol, propanol, isopropanol, heptanol, octanol and any combination thereof, and
wherein the metal-containing layer is a titanium (Ti) layer, a titanium nitride (TiN) layer, a tantalum (Ta) layer, a tantalum nitride (TaN) layer, an aluminum (Al) layer, a tungsten (W) layer, or a copper (Cu) layer.

16. The method of claim 1, wherein the metal-containing layer comprises a titanium nitride layer, and
wherein the alcohol-based solvent is selected from the group consisting of ethanol, isopropanol and a combination thereof.

17. The method of claim 15, wherein the supercritical fluid is a supercritical carbon dioxide fluid, and
wherein removing the metal-containing layer is performed at a temperature in a range of about 31° C. to about 100° C. and at a pressure in a range of about 73 bar to about 200 bar.

\* \* \* \* \*